US012573336B2

(12) United States Patent
Kao et al.

(10) Patent No.: US 12,573,336 B2
(45) Date of Patent: Mar. 10, 2026

(54) ELECTRONIC DEVICE WITH BETTER RESOLUTION

(71) Applicant: Innolux Corporation, Miaoli County (TW)

(72) Inventors: Ker-Yih Kao, Miaoli County (TW); Ming Chun Tseng, Miaoli County (TW); Liang-Lu Chen, Miaoli County (TW); Li-Wei Mao, Miaoli County (TW); Shun-Yuan Hu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/921,008

(22) Filed: Oct. 21, 2024

(65) Prior Publication Data

US 2025/0046235 A1 Feb. 6, 2025

Related U.S. Application Data

(63) Continuation of application No. 18/459,455, filed on Sep. 1, 2023, now Pat. No. 12,148,365, which is a (Continued)

(30) Foreign Application Priority Data

Oct. 29, 2020 (CN) .......................... 202011182961.0

(51) Int. Cl.
*G09G 3/32* (2016.01)
*H10H 20/85* (2025.01)
(Continued)

(52) U.S. Cl.
CPC .......... *G09G 3/32* (2013.01); *H10H 20/8506* (2025.01); *H10H 20/856* (2025.01); *H10H 20/857* (2025.01); *H10H 29/142* (2025.01)

(58) Field of Classification Search
CPC ............................................. G09G 3/30–3291
See application file for complete search history.

(56) References Cited

U.S. PATENT DOCUMENTS

2006/0125094 A1* 6/2006 Lin ....................... H01L 23/528
257/734
2014/0346520 A1* 11/2014 Kim ..................... H10D 86/481
257/59

(Continued)

FOREIGN PATENT DOCUMENTS

CN 104183606 12/2014
CN 105702208 6/2016
CN 109658837 4/2019

OTHER PUBLICATIONS

"Office Action of China Counterpart Application", issued on Jun. 26, 2025, p. 1-p. 9.

*Primary Examiner* — Roy P Rabindranath
(74) *Attorney, Agent, or Firm* — JCIPRNET

(57) ABSTRACT

An electronic device including at least one light emitting chip, a circuit chip, and a base is provided. The base having a first surface, a second surface opposite to the first surface and at least one conductive via extending from the first surface to the second surface, the base is disposed between the at least one light emitting chip and the circuit chip, and the base is greater than one of the at least one light emitting chip in thickness. The circuit chip is electrically connected to the at least one light emitting chip through the at least one conductive via and configured to control the at least one light emitting chip.

13 Claims, 6 Drawing Sheets

Related U.S. Application Data continuation of application No. 17/984,248, filed on Nov. 10, 2022, now Pat. No. 11,790,839, which is a continuation of application No. 17/155,033, filed on Jan. 21, 2021, now Pat. No. 11,527,194.

(60) Provisional application No. 62/976,361, filed on Feb. 14, 2020.

(51) Int. Cl.
*H10H 20/856*      (2025.01)
*H10H 20/857*      (2025.01)
*H10H 29/14*      (2025.01)

(56) References Cited

U.S. PATENT DOCUMENTS

| | | | | |
|---|---|---|---|---|
| 2015/0332635 A1* | 11/2015 | Lau | ...................... | G09G 3/3266 |
| | | | | 345/83 |
| 2015/0371976 A1* | 12/2015 | Chang | ................... | H10D 86/60 |
| | | | | 257/89 |
| 2016/0190228 A1* | 6/2016 | Park | .................. | H10K 59/1315 |
| | | | | 257/40 |
| 2018/0033768 A1* | 2/2018 | Kumar | ............... | H01L 25/0753 |
| 2021/0202676 A1* | 7/2021 | Jeong | ................... | H10K 59/10 |
| 2021/0280109 A1* | 9/2021 | Xie | ...................... | H04M 1/026 |
| 2021/0399056 A1* | 12/2021 | Wang | .................. | H10K 50/865 |

* cited by examiner

ELECTRONIC DEVICE WITH BETTER RESOLUTION

CROSS-REFERENCE TO RELATED APPLICATION

This application is a continuation application of and claims the priority benefit of U.S. application Ser. No. 18/459,455, filed on Sep. 1, 2023. The prior U.S. application Ser. No. 18/459,455 is a continuation application of and claims the priority benefit of U.S. application Ser. No. 17/984,248, filed on Nov. 10, 2022. The prior U.S. application Ser. No. 17/984,248 is a continuation application of and claims the priority benefit of U.S. application Ser. No. 17/155,033, filed on Jan. 21, 2021, which claims the priority benefit of U.S. provisional application Ser. No. 62/976,361, filed on Feb. 14, 2020, and China application serial no. 202011182961.0, filed on Oct. 29, 2020. The entirety of each of the above-mentioned patent applications is hereby incorporated by reference herein and made a part of this specification.

BACKGROUND

Technical Field

The disclosure relates to an electronic device.

Description of Related Art

Currently, electronic devices (e.g., display devices) on the market have developed into maturity, but further efforts are still required for phenomena such as reducing costs, increasing energy conversion efficiency of electronic elements, facilitating wiring design, and reducing damage during transportation, etc.

SUMMARY

The present disclosure provides an electronic device, which facilitates an improvement in at least one of the above-mentioned phenomena.

According to the embodiment of the disclosure, the electronic device includes a plurality of light-emitting units, a driving circuit, and a controlling circuit. The driving circuit is configured to drive at least one light-emitting unit in the plurality of light-emitting units. The controlling circuit is configured to control the driving circuit. The plurality of light-emitting units, the driving circuit, and the controlling circuit are respectively disposed on different substrates.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figures 1, 2:
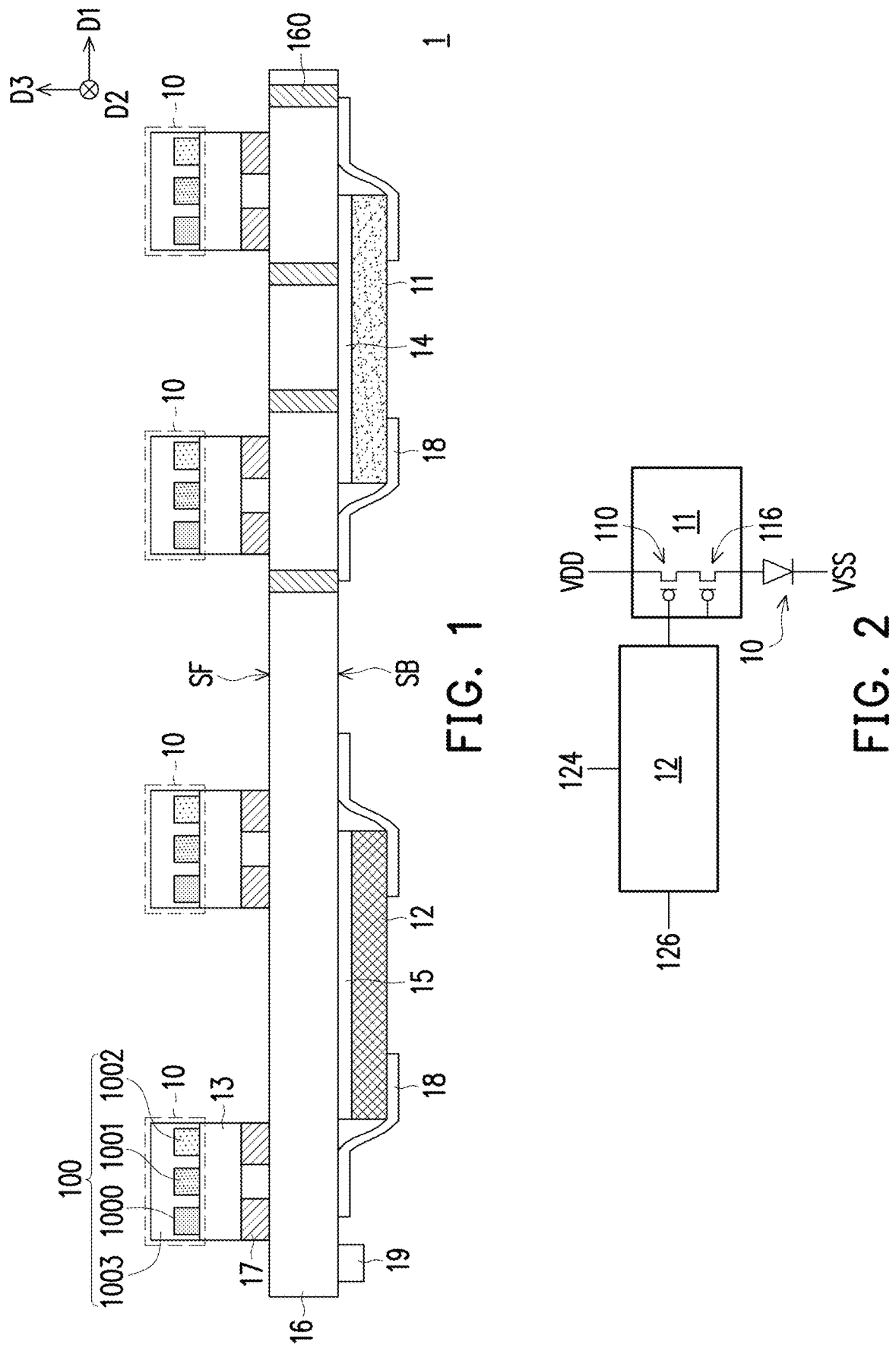
FIG. 1 is a schematic partial cross-sectional view of an electronic device according to an embodiment according to the disclosure.
FIG. 2 is a circuit diagram of the driving circuit and the controlling circuit in FIG. 1.

The disclosure may be understood with reference to the following detailed description and the accompanying drawings. It should be noted that, for ease of understanding by readers and conciseness of the drawings, the plurality of drawings in the disclosure merely show a part of an electronic device/display device, and specific elements in the drawings are not drawn to scale. Besides, the number and size of each element in the drawings only serve for exemplifying, instead of defining or limiting the scope of the disclosure. For example, a relative dimension, thickness, and position of each film layer, region, or structure may be reduced or enlarged for the sake of clarity.

Some terms are used to refer to specific elements throughout the whole specification and the appended claims in the disclosure. A person skilled in the art should understand that an electronic device manufacturer may use different names to refer to the same elements. This specification is not intended to distinguish elements that have the same functions but different names. In this specification and the claims, terms such as "have", "include", and "comprise" are open-ended terms, and should be interpreted as "including, but not limited to".

The directional terms mentioned herein, such as "above", "below", "front", "back', "left", "right", and the like, refer only to the directions in the accompanying drawings. Therefore, the directional terms are used for explaining instead of limiting the disclosure. It should be understood that when an element or film layer is referred to as being disposed "on", or "connected to" another element or film layer, the element or film layer may be directly on or connected to said another element or film layer, or intervening elements or film layers may also be present (non-direct circumstances). In contrast, when an element or film layer is referred to as being "directly on" or "directly connected to" another element, no intervening elements or film layers are present.

The term "about", "substantial", or "essential" mentioned herein typically represents a value is in a range within 10% of a given value, or a range within 5%, 3%, 2%, 1%, or 0.5% of a given value. In addition, the terms "the given range is from the first value to the second value" and "the given range falls within the range of the first value to the second value" indicate that the given range includes the first value, the second value, and other values in between.

In some embodiments of the disclosure, terms related to bonding and connection such as "connect", "interconnect", etc., unless specifically defined, may indicate the case where two structures are in direct contact, or where two structures are not in direct contact with other structures disposed in between. The terms related to bonding and connection may also cover cases where two structures are both movable or two structures are both fixed. In addition, the term "electric connect" and "couple" include any direct and indirect electrical connection means.

In the following embodiments, identical or similar reference numerals will be used to refer to identical or similar elements, and repeated description thereof will be omitted. In addition, the features in the different exemplary embodiments may be used in combination with each other without departing from or conflicting with the spirit of the disclosure, and simple equivalent variations and modifications made in accordance with this specification or the claims are still within the scope of the disclosure. Moreover, "first", "second", and similar terms mentioned in the specification or the claims are merely used to name discrete elements or to differentiate among different embodiments or ranges. Therefore, the terms should not be regarded as limiting an upper limit or a lower limit of the quantity of the elements and should not be used to limit the manufacturing sequence or arrangement sequence of elements.

In the disclosure, the electronic device may include, but is not limited to, a display device, an antenna device, a sensing device, a light-emitting device, or a tiled device. The electronic device may be a bendable or flexible electronic device. The electronic device may, for example, include a liquid crystal layer or a light-emitting diode. The light-emitting diode may include, but is not limited to, an organic light-emitting diode (OLED), a mini light-emitting diode (mini LED), a micro light-emitting diode (micro LED), a quantum dot light-emitting diode (quantum dot LED, which may include QLED and QDLED), a fluorescence, a phosphor, or other suitable material or a combination of the above. Hereinafter, a display device will be adopted as the electronic device to explain the content of the disclosure. Nonetheless, the disclosure is not limited thereto.

In the disclosure, the display device may be any type of display device, such as a self-luminous display device or a non-self-luminous display device. The self-luminous display device may include, but is not limited to, a light-emitting diode, a light conversion layer, or other suitable materials or a combination of the above. The light-emitting diode may include, but is not limited to, an organic light-emitting diode (OLED), a mini light-emitting diode (mini LED), a micro light-emitting diode (micro LED), a quantum dot light-emitting diode (quantum dot LED, which may include QLED and QDLED). The light conversion layer may include a wavelength conversion material and/or a light filter material, and the light conversion layer may include, but is not limited to, a fluorescence, a phosphor, a quantum dot (QD), other suitable materials, or a combination of the above, for example. The non-self-luminous display device may include, but is not limited to, a liquid crystal display device. Hereinafter, a self-luminous display device will be adopted as the display device to explain the content of the disclosure. Nonetheless, the disclosure is not limited thereto. In some embodiments, the chip dimension of a light-emitting diode is about 300 μm to 10 mm (300 μm≤chip dimension≤10 mm), the chip dimension of a mini light-emitting diode is about 100 μm to 300 μm (100 μm≤chip dimension≤300 μm), and the chip dimension of a micro light-emitting diode is about 1 μm to 100 μm (1 μm≤chip dimension≤100 μm). Nonetheless, the disclosure are not limited thereto.

FIG. 1 is a schematic partial cross-sectional view of an electronic device according to an embodiment according to the disclosure. With reference to FIG. 1, an electronic device 1 includes a plurality of light-emitting units 10, a driving circuit 11, and a controlling circuit 12. The driving circuit 11 is configured to drive at least one light-emitting unit 10 of the plurality of light-emitting units 10. The controlling circuit 12 is configured to control the driving circuit 11. The plurality of light-emitting units 10, the driving circuit 11, and the controlling circuit 12 are respectively disposed on different substrates, and herein the substrates refer to the substrates configured to be disposed with/carry/form the plurality of light-emitting units 10, the driving circuit 11, and the controlling circuit 12. As shown in FIG. 1, the plurality of light-emitting units 10, the driving circuit 11, and the controlling circuit 12 are, for example, disposed/formed on a substrate 13, a substrate 14, and a substrate 15. The materials of the substrate 13, the substrate 14, and the substrate 15 may be selected depending on different requirements and considerations. For example, the materials of the substrate 13, the substrate 14, and the substrate 15 may include but are not limited to glass, plastic, a wafer, or a combination thereof.

To be specific, the plurality of light-emitting units 10 may include a plurality of light-emitting diode chips, a plurality of light-emitting diode packages, or a combination thereof. FIG. 1 schematically shows that the plurality of light-emitting units 10 include the plurality of light-emitting diode packages 100, and the light-emitting diode packages 100 are disposed on the substrate 13 and include three light-emitting diode chips (e.g., a light-emitting diode chip 1000, a light-emitting diode chip 1001, and a light-emitting diode chip 1002) and a protective layer 1003. It should be understood that the type of the plurality of light-emitting units 10, the number of light-emitting diode chips in the light-emitting unit 10, the number or type of film layers in the light-emitting unit 10, the relative configuration relationship or dimensions (a length, a width, a thickness, etc.) of the elements/film layers in the light-emitting unit 10, or the like may be changed depending on requirements, and the disclosure is not limited to those shown in FIG. 1.

The three light-emitting diode chips may, for example, emit light of different colors. For example, the light-emitting diode chip 1000, the light-emitting diode chip 1001, and the light-emitting diode chip 1002 may respectively be a red light-emitting diode chip, a green light-emitting diode chip, and a blue light-emitting diode chip, but the disclosure is not limited thereto. The protective layer 1003 covers the three light-emitting diode chips and the substrate 13. The material of the protective layer 1003 may include, but is not limited to, a transparent material, a water vapor and oxygen barrier material, other suitable materials, or a combination of the above. For example, the material of the protective layer 1003 may include, but is not limited to, epoxy, an acrylic-based resin, silicone, a polyimide polymer, or a combination of the above.

The plurality of light-emitting units 10 may be arranged into an array. For example, the plurality of light-emitting units 10 may be arranged into a two-dimensional matrix along a first direction D1 and a second direction D2. The first direction D1 and the second direction D2 intersect each other and are each perpendicular to a thickness direction (e.g., a third direction D3) of the electronic device 1. FIG. 1 schematically shows that the first direction D1 and the second direction D2 are perpendicular to each other, but the disclosure is not limited thereto. In some embodiments, it is not required that the first direction D1 and the second direction D2 intersect at an angle perpendicular to each other.

In some embodiments, the electronic device 1 may also include a circuit board 16. The circuit board 16 may include a thin film, a board, or a combination of the above having a wiring line. For example, the circuit board 16 may include, but is not limited to, a printed circuit board (PCB) or a flexible printed circuit board (FPCB).

The plurality of light-emitting units 10, the driving circuit 11, and the controlling circuit 12 may be disposed on the circuit board 16 through bonding in any known form, and the respective forms in which the three are bonded to the circuit board 16 may be the same or different. FIG. 1 schematically shows that the plurality of light-emitting units

10 are electrically connected to the circuit board 16 through a plurality of conductive bumps 17 (e.g., solders), and the driving circuit 11 and the controlling circuit 12 are electrically connected to the circuit board 16 through a connecting member 18 (e.g., a flexible flat cable or a flexible printed circuit board), but the disclosure is not limited thereto. In other embodiments, any one of the driving circuit 11 and the controlling circuit 12 may also be electrically connected to the circuit board 16 through a conductive bump 17. Besides, depending on different designs, the substrate 14 may be located between the driving circuit 11 and the circuit board 16, or the driving circuit 11 may be located between the substrate 14 and the circuit board 16. Similarly, the substrate 15 may be located between the controlling circuit 12 and the circuit board 16, or the controlling circuit 12 may be located between the substrate 15 and the circuit board 16.

Figure 3:
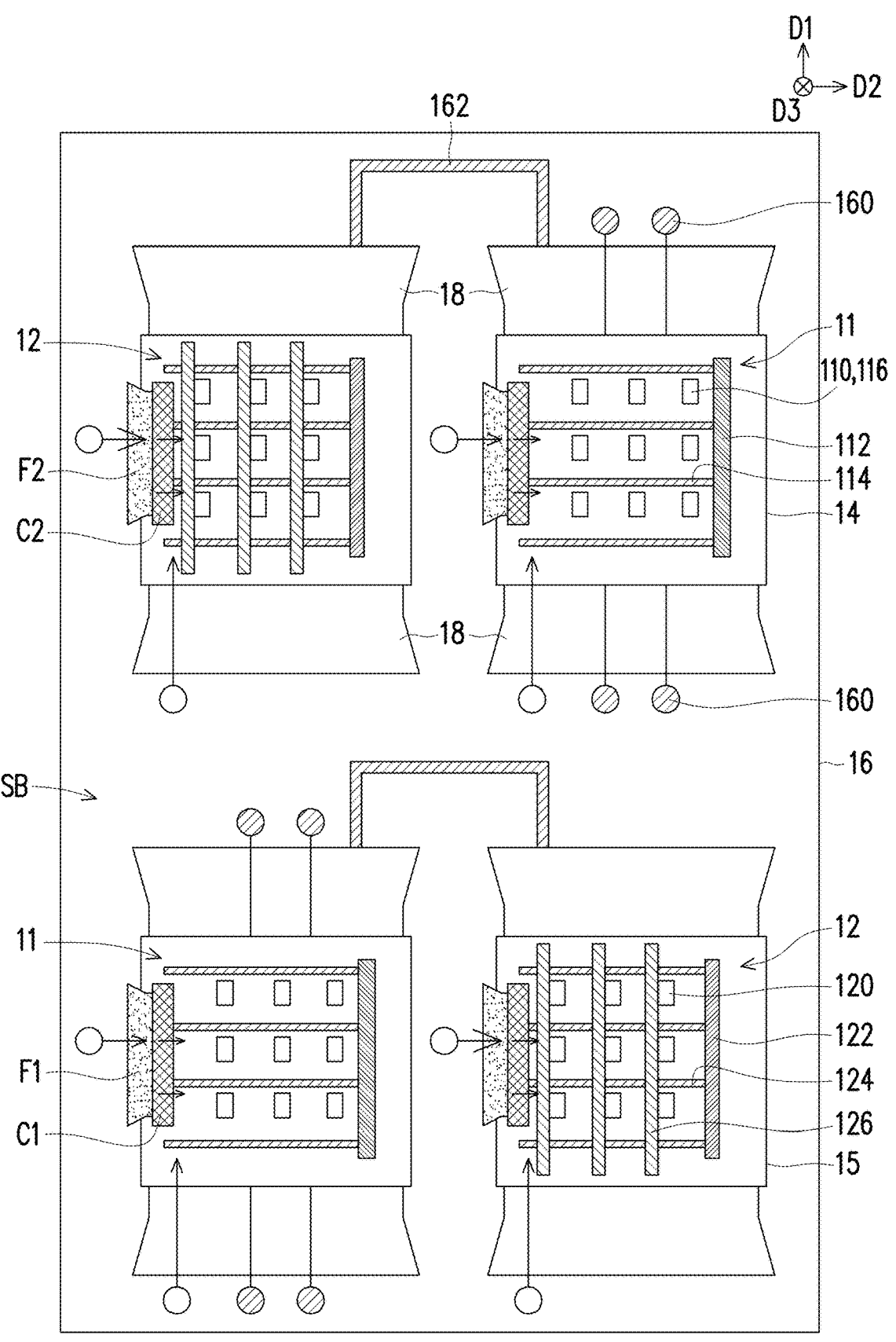
FIG. 3 is a schematic partial view of a back surface of the electronic device in FIG. 1.

FIG. 2 is a circuit diagram of the driving circuit and the controlling circuit in FIG. 1. FIG. 3 is a schematic partial view of a back surface of the electronic device in FIG. 1. With reference to FIG. 1 to FIG. 3, the driving circuit 11 may be electrically connected to at least one light-emitting unit 10 through the circuit board 16. For example, the driving circuit 11 may be electrically connected to the at least one light-emitting unit 10 through a conductive via 160 (shown in FIG. 1 and FIG. 3) in the circuit board 16, but is not limited thereto. Alternatively, the driving circuit 11 may be electrically connected to the at least one light-emitting unit 10 through an interconnect structure in the circuit board 16 (including such as a plurality of vias and a plurality of metal layers). On the other hand, the controlling circuit 12 may be electrically connected to the driving circuit 11 through the circuit board 16. For example, the controlling circuit 12 may be electrically connected to the driving circuit 11 through a wiring line 162 (shown in FIG. 3) on the circuit board 16, but is not limited thereto.

In some embodiments, the driving circuit 11 may include a driving transistor 110 configured to drive the at least one light-emitting unit 10, and the controlling circuit 12 may include a controlling transistor 120 configured to control the driving transistor 110. As shown in FIG. 2 and FIG. 3, the driving circuit 11 may be an integrated circuit (IC) or a chip including a plurality of driving transistors 110. On the other hand, the controlling circuit 12 may also be an integrated circuit or a chip including a plurality of controlling transistors 120.

To be specific, the plurality of driving transistors 110 and other elements (e.g., a light-emitting signal generator 112, a plurality of signal lines 114, a light-emitting signal controlling transistor 116, etc.) may be formed on the substrate 14. Then, a plurality of driving circuits 11 are formed through a packaging process and a singulation process (e.g., a cutting process). Each driving circuit 11 may include the plurality of driving transistors 110 and other elements (e.g., the light-emitting signal generator 112, the plurality of signal lines 114, the light-emitting signal controlling transistor 116, etc.) Similarly, the plurality of controlling transistors 120 and other elements (e.g., a scan signal generator 122, a plurality of scan lines 124, a plurality of data lines 126, etc.) may be formed on the substrate 15. Then, a plurality of controlling circuits 12 are formed through a packaging process and a singulation process. Each controlling circuit 12 may include the plurality of controlling transistors 120 and other elements (e.g., the scan signal generator 122, the plurality of scan lines 124, the plurality of data lines 126, etc.) In some embodiments, the controlling circuit 12 may also include, but is not limited to, a bias compensation element (not shown), a capacitor (not shown), or a combination thereof.

Therein, the bias compensation element (not shown) may be an element that compensates for the bias of the threshold voltage.

In some embodiments, an extension direction of the plurality of data lines 126 may be substantially parallel to the first direction D1, and an extension direction of the plurality of scan lines 124 may be substantially parallel to the second direction D2, but the disclosure is not limited thereto.

As shown in FIG. 2, the controlling circuit 12 (e.g., the controlling transistor 120) may receive signals from the scan line 124 and the data line 126. The driving transistor 110 of the driving circuit 11 is electrically connected between a signal terminal VDD and the light-emitting signal controlling transistor 116, the light-emitting signal controlling transistor 116 is electrically connected between the driving transistor 110 and the light-emitting unit 10, and the light-emitting unit 10 is electrically connected between the light-emitting signal controlling transistor 116 and a signal terminal VSS.

As shown in FIG. 3, the signal from the circuit board 16 may be transmitted through a connecting layer F1 to a chip C1. The connecting layer F1 may be a substrate having a wiring line, and the chip C1 may be a chip-on-glass (COG) package or a chip-on-flex (COF) package, but the disclosure is not limited thereto. The chip C1 may transmit a signal to the driving transistor 110 and the light-emitting signal controlling transistor 116 of the driving circuit 11, and the signal transmitted to the light-emitting signal controlling transistor 116 may be transmitted through the conductive via 160 to the corresponding light-emitting unit 10 to drive the corresponding light-emitting unit 10. On the other hand, the signal from the circuit board 16 may be transmitted to a chip C2 via a connecting layer F2. For the types of the connecting layer F2 and the chip C2, reference may be made to the connecting layer F1 and the chip C1, and will not be repeated herein. The chip C2 may transmit a signal through the scan line 124, the data line 126, and the scan signal generator 122 to the controlling transistor 120 of the controlling circuit 12, and transmit a signal through the wiring line 162 to the driving transistor 110 of the driving circuit 11. It should be understood that design parameters such as the number, the dimension, or the arrangement of each of the elements (e.g., the transistors or other wiring lines) in the driving circuit 11 or the controlling circuit 12 may be changed depending on requirements, and are not limited to those shown in FIG. 3.

With reference to FIG. 1 again, the plurality of light-emitting units 10 may be disposed on a front surface SF of the circuit board 16 to provide light beams. On the other hand, the driving circuit 11 and the controlling circuit 12 may be disposed on a back surface SB of the circuit board 16 to reduce the influence of the driving circuit 11 and the controlling circuit 12 on the visual effect or reduce the visibility of the driving circuit 11 and the controlling circuit 12. In some embodiments, each light-emitting unit 10 may be controlled by one or more driving circuits 11 and one or more controlling circuits 12. In other embodiments, each driving circuit 11 and the corresponding controlling circuit 12 may control one or more light-emitting units 10. The respective quantities of the light-emitting units 10, the driving circuit 11, and the controlling circuit 12 in the electronic device 1 may be changed depending on requirements and are not limited herein.

Since the plurality of driving transistors 110 and the plurality of controlling transistors 120 are respectively fabricated on different substrates (e.g., the substrate 14 and the substrate 15) and then bonded to the circuit board 16, the driving transistor 110 and the controlling transistor 120 may therefore respectively have channels comprising different materials. For example, a channel of the driving transistor 110, which requires the generation of a large current to control the light-emitting unit 10, may have an electron mobility greater than an electron mobility of a channel of the controlling transistor 120. In this way, an IR drop caused by a large cross-voltage of the driving transistor 110 may be alleviated, facilitating an increase in the energy conversion efficiency. For example, the material of the channel of the driving transistor 110 may include monocrystalline silicon, and the material of the channel of the controlling transistor 120 may include polycrystalline silicon, amorphous silicon, or metal oxide, but the disclosure is not limited thereto. In some embodiments, based on the consideration of costs or reliability, the driving transistor 110 and the light-emitting signal controlling transistor 116 may also be a metal-oxide-semiconductor field-effect transistor (MOSFET), a bipolar junction transistor (BJT), an indium gallium zinc oxide thin film transistor (IGZO TFT), an organic thin film transistor (OTFT), or a microcrystalline silicon thin film transistor (μ-Si TFT).

The design in which the plurality of driving transistors 110 are integrated into a chip (integration) facilitates reduction in the damage resulting from impact or collision by an external force during transportation or movement, thereby facilitating an increase in a yield rate or cost reduction. Besides, the plurality of driving transistors 110 are disposed on the circuit board 16 in the form of chips, therefore facilitating an increase in the utilization rate of the wiring space, convenience in the wiring, or an increase in the flexibility of the wiring design. In addition, the convenience in repair and replacement facilitates an increase in a yield rate or cost reduction. Furthermore, the wiring line in the circuit board 16 may comprise copper or other materials having a low-resistivity, therefore facilitating reduction in the generation of heat sources or cost reduction.

Depending on different requirements, the electronic device 1 may also include other elements. For example, the electronic device 1 may also include an element 19. The element 19 may include a chip, a resistor, a capacitor, or other elements, and is not specifically limited herein. In any embodiment of the disclosure, the same change may be made and will not be repeatedly described hereinafter.

Figure 4:
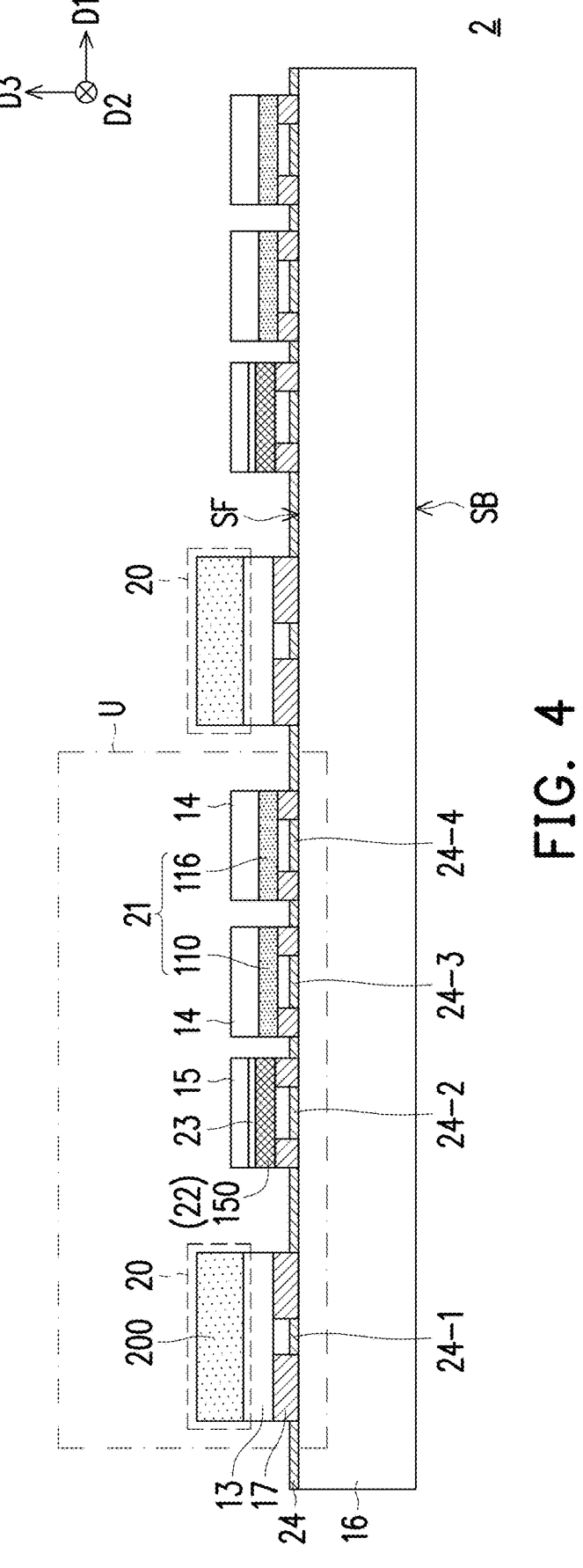
FIG. 4 to FIG. 8 are respectively schematic partial cross-sectional views of electronic devices according to other embodiments of the disclosure.

FIG. 4 to FIG. 8 are respectively schematic partial cross-sectional views of electronic devices according to other embodiments of the disclosure. With reference to FIG. 4, an electronic device 2 includes a plurality of light-emitting units 20, a plurality of driving circuits 21, a plurality of controlling circuits 22, a plurality of substrates 13, a plurality of substrates 14, a plurality of substrates 15, the circuit board 16, a polyimide layer 23, and an optical film 24.

The plurality of light-emitting units 20 are disposed on the plurality of substrates 13, and the plurality of substrates 13 may be electrically connected to the circuit board 16 through the plurality of conductive bumps 17. The plurality of light-emitting units 20 may include a plurality of light-emitting diode chips 200. In addition, the material of the substrate 13 may be selected from glass, but is not limited thereto. Depending on different applications (e.g., serving as a backlight of a non-self-luminous display or as a self-luminous display), the plurality of light-emitting diode chips 200 may emit light of the same or different colors. In some embodiments, the light-emitting unit 20 may also include, but is not limited to, a light conversion layer, a color filter layer, or other suitable materials or a combination of the above.

The plurality of driving circuits 21 are disposed on the plurality of substrates 14. The plurality of driving circuits 21 are located between the circuit board 16 and the plurality of substrates 14. The plurality of driving circuits 21 may be electrically connected to the circuit board 16 through the plurality of conductive bumps 17. The material of the substrate 14 may include, but is not limited to, a wafer.

In this embodiment, it is possible that the driving transistor 110 and the light-emitting signal controlling transistor 116 of the driving circuit 21 are not integrated into an integrated circuit. As shown in FIG. 4, the driving transistor 110 and the light-emitting signal controlling transistor 116 may be respectively disposed on different substrates 14 and then electrically connected to the circuit board 16 through the plurality of conductive bumps 17. In this way, the volume of each individual (e.g., the driving transistor 110 and the substrate 14, or the light-emitting signal controlling transistor 116 and the substrate 14) in the driving circuit 21 may be decreased or the visibility of each individual may be reduced. Under this architecture, the driving circuit 21 may be disposed on the front surface SF of the circuit board 16 in addition to the back surface SB of the circuit board 16.

The plurality of controlling circuits 22 are disposed on the plurality of substrates 15. The plurality of controlling circuits 22 are located between the circuit board 16 and the plurality of substrates 15. The plurality of controlling circuits 22 may be electrically connected to the circuit board 16 through the plurality of conductive bumps 17. In this embodiment, the number of controlling transistor 150 in each controlling circuit 22 may be one, and the one transistor may be disposed on the substrate 15 and then electrically connected to the circuit board 16 through the plurality of conductive bumps 17. In other words, it is also possible that the controlling circuit 22 is not integrated into an integrated circuit. In this way, the volume of each individual (e.g., the controlling transistor 150 and the substrate 15) in the controlling circuit 22 may be decreased or the visibility of each individual may be reduced. Under this architecture, the controlling circuit 22 may be disposed on the front surface SF of the circuit board 16 in addition to the back surface SB of the circuit board 16.

In some embodiments, the plurality of light-emitting units 20, the driving circuit 21, and the controlling circuit 22 may all be disposed on the front surface SF of the circuit board 16, reducing the steps and difficulty of the manufacturing process.

In the embodiment of FIG. 4, the electronic device 2 may include a plurality of minimum units U. The plurality of minimum units U may be arranged along the first direction D1 and the second direction D2. The minimum unit U may include a light-emitting unit 20, a driving circuit 21, and a controlling circuit 22, and each light-emitting unit 20 is controlled by a driving circuit 21 and a controlling circuit 22. In other embodiments, each light-emitting unit 20 may be controlled by a plurality of driving circuits 21 and a plurality of controlling circuits 22. Alternatively, a plurality of light-emitting units 20 may be controlled by one driving circuit 21 and one controlling circuit 22.

The polyimide layer 23 is disposed between the plurality of controlling circuits 22 and the substrate 15 on which the plurality of controlling circuits 22 are disposed. The hardness of the plurality of substrates 15 may be greater than the hardness of the polyimide layer 23. For example, the material of the plurality of substrates 15 may include, but is not limited to, glass. By disposing the plurality of substrates 15, not only the plurality of controlling circuits 22 may be protected, but supportability may also be provided so that the plurality of controlling circuits 22 may be formed on the polyimide layer 23. In addition, since the polyimide layer 23 is relatively soft, the polyimide layer 23 may serve as a buffer between the plurality of substrates 15 and the plurality of controlling circuits 22, alleviating in cracking of the plurality of substrates 15 due to thermal expansion and contraction. In other embodiments, it is possible that the electronic device 2 does not include the polyimide layer 23.

The optical film 24 may be a light reflecting layer. In this embodiment, the optical film 24 is disposed on the front surface SF of the circuit board 16 and located in a region on which the plurality of the conductive bumps 17 are not disposed. The optical film 24 (e.g., a light reflecting layer) may be configured to reflect light to increase the light utilization rate. For example, the material of the optical film 24 may include, but is not limited to, a white adhesive, paint, or tape. In FIG. 4, the optical film 24 includes a portion (e.g., a portion 24-1 to a portion 24-4) overlapping the light-emitting unit 20, the controlling circuit 22, the driving transistor 110, and the light-emitting signal controlling transistor 116 in the third direction D3. In other embodiments, it is possible that the optical film 24 does not include the portion (e.g., the portion 24-1 to the portion 24-4) overlapping the light-emitting unit 20, the controlling circuit 22, the driving transistor 110, and the light-emitting signal controlling transistor 116 in the third direction D3. In still other embodiments, the optical film 24 may further cover elements (e.g., the substrate 15 and the substrate 14) other than the plurality of light-emitting units 20. In the following embodiments of the disclosure, the same change may be made and will not be repeatedly described hereinafter.

In some embodiments, the optical film 24 may be a light absorbing layer and is configured to absorb light, increasing the contrast. Notably, the light absorbed by the light absorbing layer is light that interferes with or affects the quality of light emitted by the light-emitting unit. Besides, in some embodiments, the optical film 24 may selectively dispose a light reflecting layer in some regions and dispose a light absorbing layer in some other regions, depending on the optical design of the electronic device. Nonetheless, the disclosure is not limited thereto.

Figure 5:
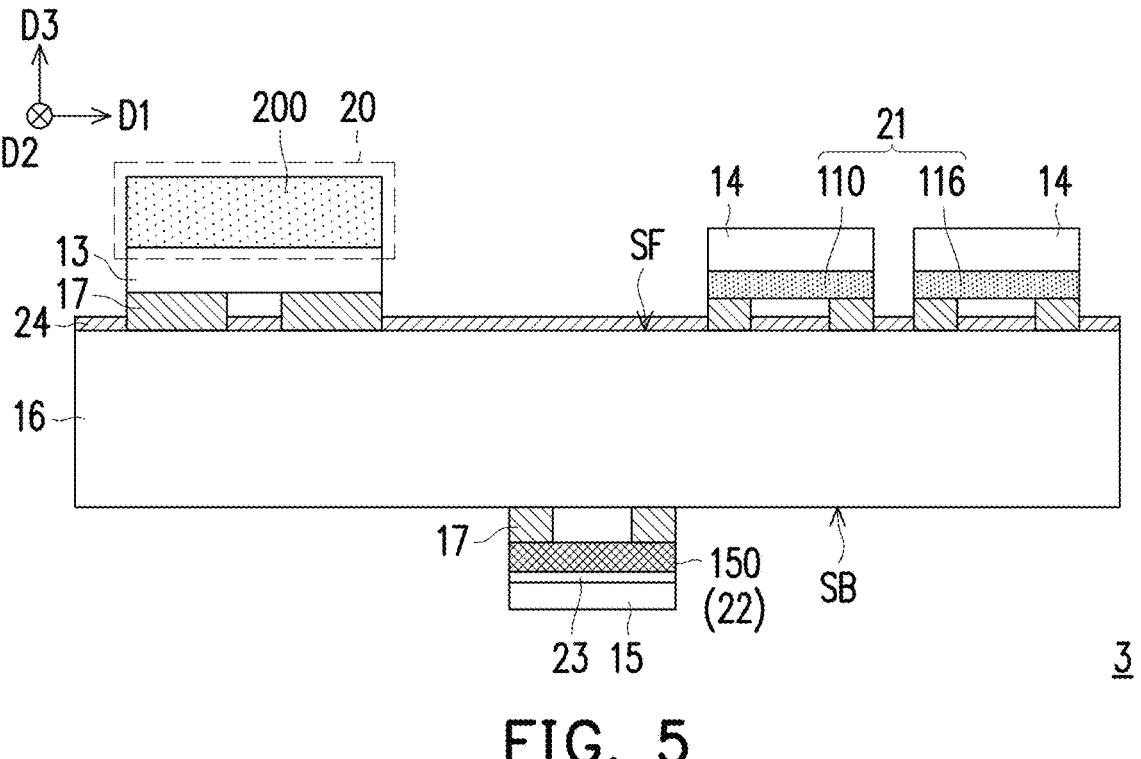

With reference to FIG. 5, in an electronic device 3, the controlling circuit 22, the polyimide layer 23, and the substrate 15 are disposed on the back surface SB of the circuit board 16, and the controlling circuit 22 is electrically connected to the circuit board 16 through the plurality of conductive bumps 17. In this way, the pitch between two adjacent minimum units U (referring to FIG. 4) may be reduced, facilitating an increase in the density of the lit area, and further facilitating an increase in the resolution of the electronic device 3.

Figure 6:
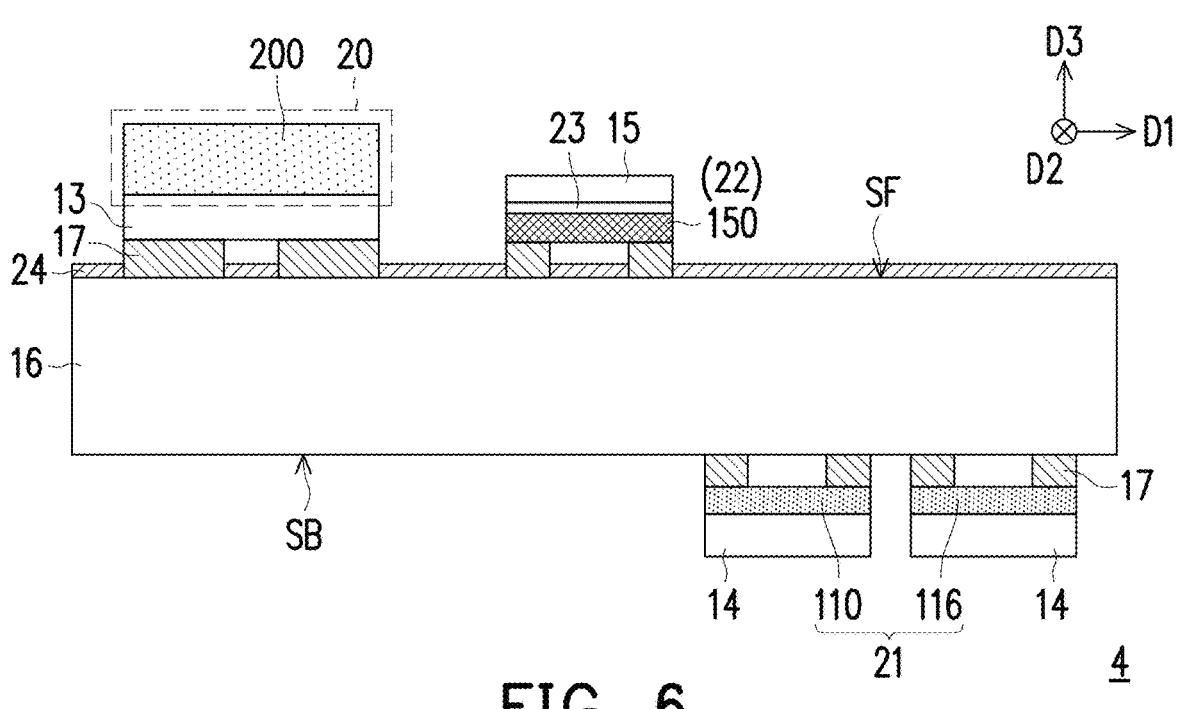

With reference to FIG. 6, in an electronic device 4, the driving circuit 21 and the substrate 14 are disposed on the back surface SB of the circuit board 16, and the driving circuit 21 is electrically connected to the circuit board 16 through the plurality of conductive bumps 17. In this way, the pitch between two adjacent minimum units U (referring to FIG. 4) may be reduced, facilitating an increase in the density of the lit area, and further facilitating an increase in the resolution of the electronic device 4.

Figure 7:
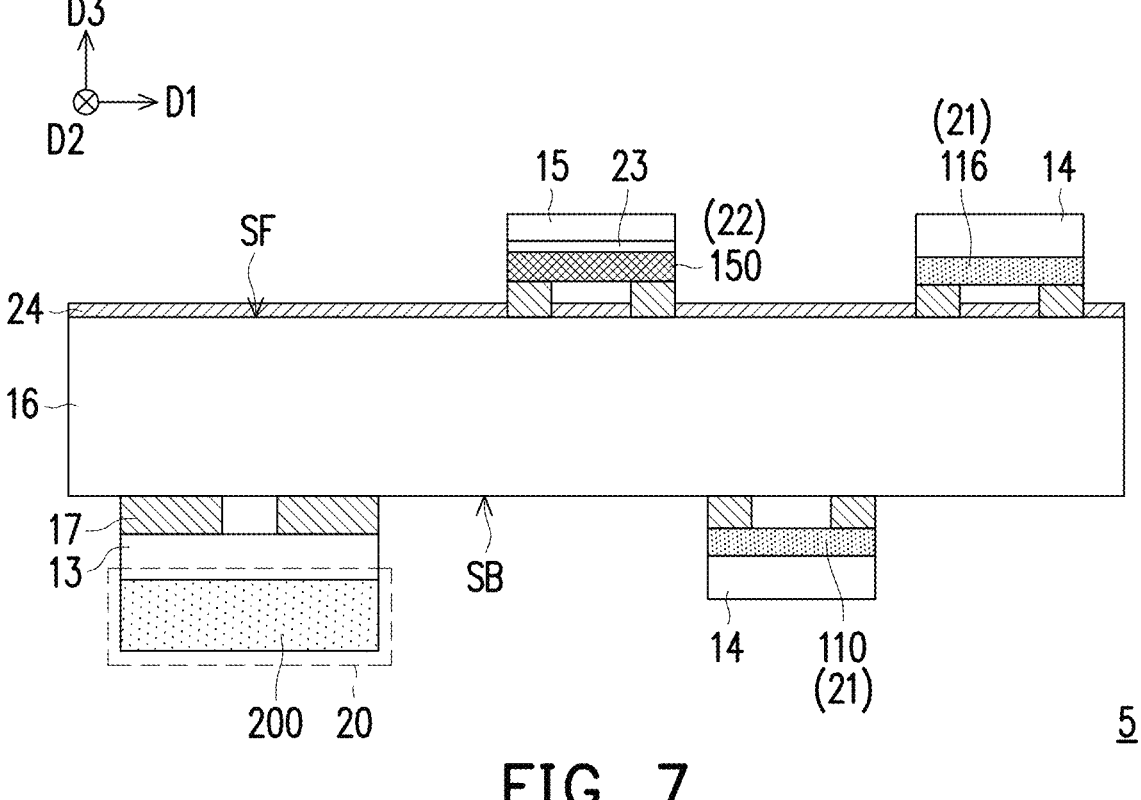

With reference to FIG. 7, in an electronic device 5, the driving transistor 110 of the driving circuit 21, the substrate 14, the light-emitting unit 20, and the substrate 13 are disposed on the back surface SB of the circuit board 16, and the driving transistor 110 and the light-emitting unit 20 are electrically connected to the circuit board 16 through the plurality of conductive bumps 17. In this way, the pitch between two adjacent minimum units U (referring to FIG. 4) may be reduced, facilitating an increase in the density of the lit area, and further facilitating an increase in the resolution of the electronic device 5.

It should be understood that the light-emitting unit 20, the driving circuit 21, and the controlling circuit 22 may each be disposed on the front surface SF or the back surface SB of the circuit board 16. In addition, the protection scope of the disclosure includes any combination of the above-mentioned three configurations, and is not limited to those shown in FIG. 4 to FIG. 7.

Figure 8:
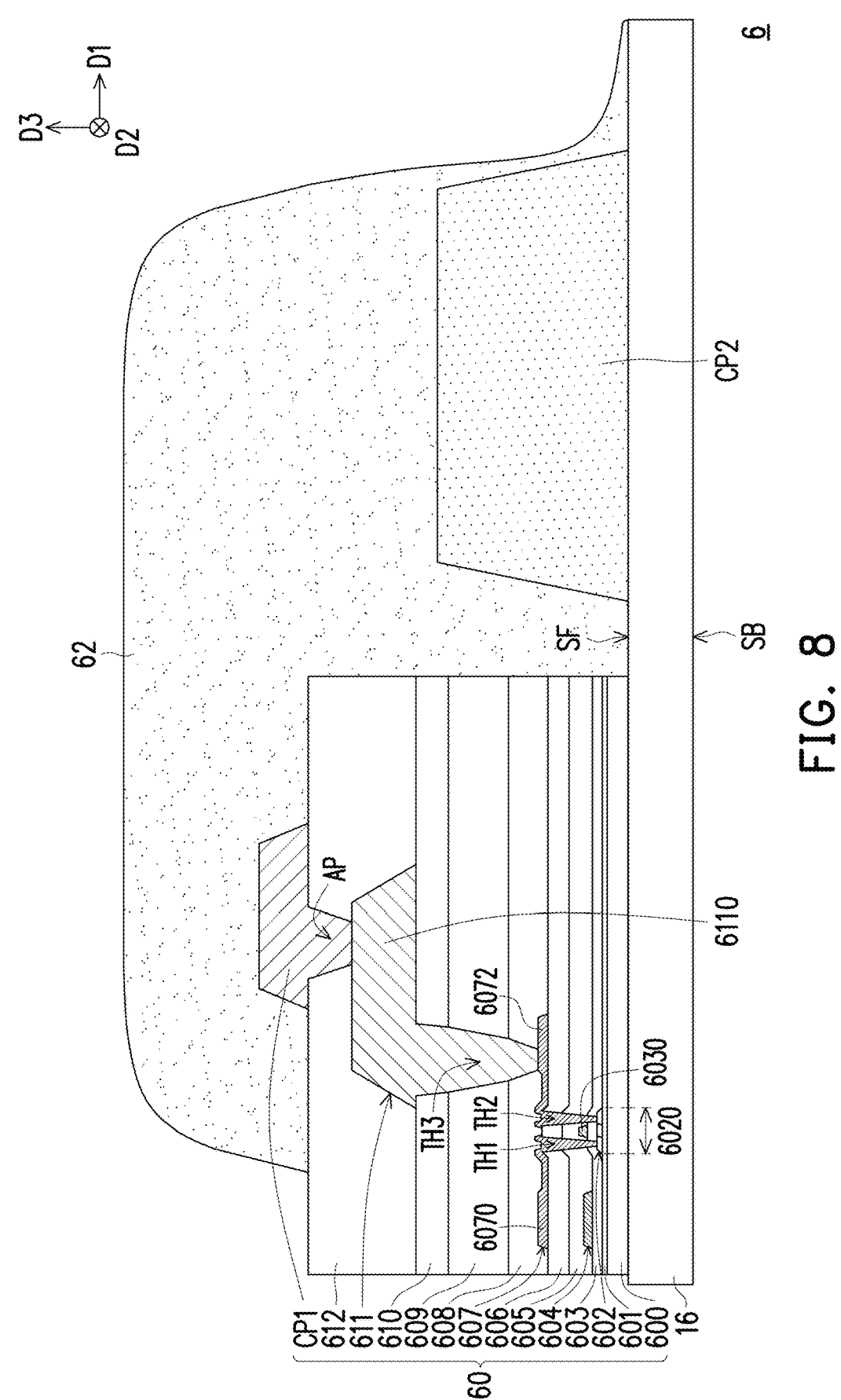

In the embodiment of FIG. 4 to FIG. 7, the light-emitting unit 20, the driving circuit 21, and the controlling circuit 22 are electrically connected to the circuit board 16 through the plurality of conductive bumps 17, but the electrical connection between the three elements and the circuit board 16 is not limited thereto. For example, the three elements may also be electrically connected to the circuit board 16 through an anisotropic conductive film (ACF), but is not limited thereto. As shown in FIG. 8, in an electronic device 6, the element 60 may be disposed on the front surface SF of the circuit board 16 through an adhesive member (not shown, such as an adhesive, tape, or the like). Alternatively, although not shown, the element 60 may also be disposed on the back surface SB of the circuit board 16 through an adhesive member. A conductor 62 covers a pad CP1 of the element 60 and a pad CP2 of the circuit board 16. The pad CP1 of the element 60 may be electrically connected to the pad CP2 of the circuit board 16 through the conductor 62. For example, the material of the pad CP1 and the pad CP2 may include, but is not limited to, nickel and gold. The conductor 62 may include tin, a conductive adhesive (of which the material may be copper or silver), or other suitable conductive materials.

In this embodiment, in addition to the pad CP1, the element 60 also includes a polyimide substrate 600, a buffer layer 601, an active layer 602, a gate isolating layer 603, a conductive layer 604, an isolating layer 605, an isolating layer 606, a conductive layer 607, an isolating layer 608, an isolating layer 609, an isolating layer 610, a conductive layer 611, and an isolating layer 612. The buffer layer 601, the active layer 602, the gate isolating layer 603, the conductive layer 604, the isolating layer 605, the isolating layer 606, the conductive layer 607, the isolating layer 608, the isolating layer 609, the isolating layer 610, the conductive layer 611, the isolating layer 612, and the pad CP1 are sequentially disposed on the circuit board 16. The conductive layer 604 is a patterned conductive layer. For example, the conductive layer 604 may include a gate 6030 disposed on a channel 6020 of the active layer 602 and other elements (e.g., a signal line, etc.). The conductive layer 607 is a patterned conductive layer. For example, the conductive layer 607 may include a source 6070, a drain 6072, and other elements (e.g., a signal line, etc.) The source 6070 and the drain 6072 may be connected to the channel 6020 of the active layer 602 respectively via through holes TH1 and TH2 penetrating the gate isolating layer 603, the isolating layer 605, and the isolating layer 606. The conductive layer 611 is a patterned conductive layer. For example, the conductive layer 611 may include an electrode 6110 and other elements. The electrode 6110 may be connected to the drain 6072 via a through hole TH3 penetrating the isolating layer 608, the isolating layer 609, and the isolating layer 610. The pad CP1 may be connected to the electrode 6110 through an aperture AP of the isolating layer 612.

It should be understood that the element 60 is merely schematic, and the number, type, dimension, relative configuration relationship, or other design parameters of film layers in the element 60 may be changed depending on requirements. Besides, the element 60 may be a transistor of the driving circuit 21, a transistor of the controlling circuit 22, an integrated circuit, the light-emitting unit 20, or the like in the foregoing embodiments.

For ease of description, FIG. 8 only shows one pad CP1 of the element 60 and one pad CP2 of the circuit board 16. Nonetheless, the number of pad CP1 of the element 60 and the number of pad CP2 of the circuit board 16 may be changed depending on requirements. The lateral connection of the pad CP1 with the pad CP2 using the conductor 62 facilitates an increase in the consistency in impedance.

In summary of the foregoing, in the embodiment of the disclosure, through disposing the plurality of light-emitting units, the driving circuit, and the controlling circuit on different substrates, the selection of the material of the substrate on which the plurality of light-emitting units are positioned is no longer limited by the thin film transistor manufacturing process, and the material of the substrate on which the plurality of light-emitting units are positioned may be selected depending on requirements (e.g., the fixing power of the plurality of light-emitting units, whether the through hole manufacturing process is facilitated, among other considerations). Similarly, the material of the substrate on which the driving circuit and the controlling circuit are positioned may also be selected depending on requirements. In addition, the driving transistor and the controlling transistor may respectively have channels comprising different materials. For example, the channel of the driving transistor may have an electron mobility greater than an electron mobility of the channel of the controlling transistor. In this way, the IR drop caused by a large cross-voltage of the driving transistor may be alleviated, facilitating an increase in the energy conversion efficiency. In some embodiments, the design in which the plurality of driving transistors are integrated into a chip (integration) facilitates reduction in the damage resulting from impact or collision by an external force during transportation or movement, thereby facilitating an increase in a yield rate or cost reduction. Besides, the plurality of driving transistors are disposed on the circuit board in the form of chips, therefore facilitating an increase in the utilization rate of the wiring space, convenience in the wiring, or an increase in the flexibility of the wiring design. In addition, the convenience in repair and replacement facilitates an increase in a yield rate or cost reduction. Furthermore, the wiring line in the circuit board may comprise copper or other materials having a low-resistivity, therefore facilitating reduction in the generation of heat sources or cost reduction. In some embodiment, the plurality of driving transistors may be respectively disposed on the plurality of substrates, and the plurality of controlling transistors may be respectively disposed on the plurality of substrates. The light-emitting unit, the driving circuit, and the controlling circuit may be disposed on the front surface and the back surface of the circuit board to reduce the pitch between two adjacent minimum units, facilitating an increase in the density of the lit area, and further facilitating an increase in the resolution of the electronic device. In some embodiments, lateral connection of the pad of at least one of the light-emitting unit, the driving circuit, and the controlling circuit with the pad of the circuit board using the conductor facilitates an increase in the consistency in impedance.

The foregoing embodiments are only used to explain, instead of limiting, the technical solutions of the disclosure. Although the disclosure has been described in detail with reference to the foregoing embodiments, people having ordinary skill in the art should understand that the technical solutions described in the foregoing embodiments may still be modified, or that some or all technical features therein may be equivalently replaced. However, the nature of the corresponding technical solutions so modified or replaced does not depart from the scope of the technical solutions of the embodiments of the disclosure.

Although the embodiments and the advantages thereof have been disclosed as above, it should be understood that people having ordinary skill in the art may make combinations, variations, replacements, and modifications without departing from the spirit and scope of the disclosure, and the feature in each embodiment may be arbitrarily mixed with and replaced by each other to form another new embodiment. In addition, the protection scope of the disclosure is not limited to a process, machine, manufacturing, material composition, device, method, and step in a specific embodiment in this specification. People having ordinary skill in the art may understand that the existing or to-be-developed process, machine, manufacturing, material composition, device, method, and step from the content of the disclosure may be used according to the disclosure as long as the substantially same function can be implemented or the substantially same result can be obtained in the embodiments described herein. Therefore, the protection scope of the disclosure includes the foregoing process, machine, manufacturing, material composition, device, method, and step. In addition, each claim forms an independent embodiment, and the protection scope of the disclosure also includes a combination of each of the claims and embodiments. The protection scope of the disclosure should be subject to the appended claims.

What is claimed is:

1. An electronic device, comprising:
at least one light emitting chip;
a first circuit chip;
a base having a first surface, a second surface opposite to the first surface and at least one conductive via extending from the first surface to the second surface, wherein the base is disposed between the at least one light emitting chip and the first circuit chip, and the base is greater than the at least one light emitting chip in thickness,
wherein the first circuit chip is electrically connected to the at least one light emitting chip through the at least one conductive via and configured to control the at least one light emitting chip; and
a first conductive line and a second conductive line arranged on the base, wherein the first conductive line is electrically connected to the at least one light emitting chip, and the second conductive line is electrically connected to the first circuit chip,
wherein the first conductive line is electrically connected to the second conductive line through the at least one conductive via.

2. The electronic device according to claim 1, further comprising an optical film disposed between the base and the at least one light emitting chip.

3. The electronic device according to claim 2, wherein the optical film at least partially overlaps the at least one light emitting chip in a top view direction of the base.

4. The electronic device according to claim 2, wherein the optical film is a light reflecting layer.

5. The electronic device according to claim 1, further comprising a plurality of conductive bumps, wherein the at least one light emitting chip are electrically connected to the first conductive line through the plurality of conductive bumps.

6. The electronic device according to claim 5, wherein the plurality of conductive bumps are solders.

7. The electronic device according to claim 1, wherein the first circuit chip comprises a circuit layer and a substrate, and the circuit layer is disposed on the substrate.

8. The electronic device according to claim 7, wherein the substrate comprises glass.

9. The electronic device according to claim 1, wherein the base comprises glass.

10. The electronic device according to claim 1, wherein the at least one light emitting chip is not overlapped with the at least one conductive via.

11. The electronic device according to claim 1, further comprising a second circuit chip, wherein the second circuit chip is electrically connected to the first circuit chip and transmits signals to the first circuit chip.

12. The electronic device according to claim 11, wherein the second circuit chip is a chip on glass package or a chip on flex package.

13. The electronic device according to claim 1, wherein the at least one light emitting chip is electrically connected to the base through an anisotropic conductive film.

\* \* \* \* \*